(12) United States Patent
Nakaie et al.

(10) Patent No.: US 7,609,076 B2
(45) Date of Patent: Oct. 27, 2009

(54) METHOD OF MEASURING CHARACTERISTIC IMPEDANCE OF ELECTROSTATIC DISCHARGE PROTECTING CIRCUIT AND APPARATUS FOR REALIZING THE SAME

(75) Inventors: Toshiyuki Nakaie, Wakayama (JP); Masanori Sawada, Wakayama (JP); Taizo Shintani, Wakayama (JP); Natarajan Mahadeva Iyer, Heverlee (BE); David Eric Tremouilles, Heverlee (BE)

(73) Assignee: Hanwa Electronic Ind. Co., Ltd., Wakayama (JP)

( * ) Notice: Subject to any disclaimer, the term of this patent is extended or adjusted under 35 U.S.C. 154(b) by 179 days.

(21) Appl. No.: 11/749,912

(22) Filed: May 17, 2007

(65) Prior Publication Data
US 2008/0004820 A1    Jan. 3, 2008

(30) Foreign Application Priority Data
Jul. 3, 2006    (JP) .............................. 2006-182908

(51) Int. Cl.
*G01R 27/08*    (2006.01)
(52) U.S. Cl. ........................ 324/713; 324/678; 324/763; 330/299
(58) Field of Classification Search .................. 324/713
See application file for complete search history.

(56) References Cited

U.S. PATENT DOCUMENTS

| | | | | |
|---|---|---|---|---|
| 5,361,776 A | * | 11/1994 | Samuelson et al. .......... | 600/547 |
| 6,429,674 B1 | * | 8/2002 | Barth et al. .................. | 324/763 |
| 6,720,828 B2 | * | 4/2004 | Nelson et al. ............... | 330/144 |
| 2004/0239346 A1 | | 12/2004 | Iyer et al. | |
| 2006/0176044 A1 | * | 8/2006 | Binder et al. ............... | 324/71.1 |
| 2007/0159186 A1 | * | 7/2007 | Grund ........................ | 324/678 |

FOREIGN PATENT DOCUMENTS

EP            654673 A1 *    5/1995

OTHER PUBLICATIONS

Measurement of Impedances under Dynamic Pulse Conditions, IBM Technical Disclosure Bulletin NN66041507, Apr. 1, 1966.*
T. Daenen et al, "Multilevel Transmission Line Pulse (MTLF) Tester", 2004 EOS/ESD Symposium.

* cited by examiner

*Primary Examiner*—Timothy J Dole
*Assistant Examiner*—Benjamin M Baldridge
(74) *Attorney, Agent, or Firm*—Richard M. Goldberg

(57) ABSTRACT

A method of quickly measuring a characteristic impedance of an ESD protecting circuit by applying a discharge voltage to the ESD protecting circuit, includes the steps of measuring a variation in discharge voltage applied to and a variation in discharge current caused to flow through the ESD protecting circuit with time; simultaneously detecting a state when both the discharge voltage and discharge current corresponding to each other are attenuated, after both the discharge voltage and discharge current sequentially rise to arrive individually to respective peak values based on an input to or an output from a computer; and taking a ratio of the variation of discharge voltage to the variation of discharge current during the attenuation as an impedance value when the ratio is nearly constant as well as an apparatus for realizing the same.

12 Claims, 4 Drawing Sheets

METHOD OF MEASURING
CHARACTERISTIC IMPEDANCE OF
ELECTROSTATIC DISCHARGE
PROTECTING CIRCUIT AND APPARATUS
FOR REALIZING THE SAME

BACKGROUND OF THE INVENTION

The present invention relates to a method of measuring a characteristic impedance of an electrostatic discharge protecting circuit which is used in a circuit by semiconductor devices, a magnetic head circuit or the like, and an apparatus for realizing the same.

DESCRIPTION OF THE INVENTION

In recent years, increases in capacity, operation speed, densification, and downsizing have progressed in semiconductor circuits and devices, a magnetic head circuit and the like. As a result, withstand voltages, and resistance against electrostatic discharge (hereinafter referred to as "ESD") have gradually reduced.

In spite of this situation, although the ESD tends to accumulate in the assembly and transport processes for these circuits, it is difficult to remove the ESD in each of these processes. It is therefore technically unavoidable to incorporate an ESD protecting circuit in any of these circuits.

Heretofore, an electrostatic breakdown test has been performed as follows for an electrostatic discharge protecting circuit (hereinafter referred to as "an ESD protecting circuit"). That is to say, a waveform of a current caused to flow through the ESD protecting circuit is observed by applying a discharge voltage which abruptly rises, and then generally and gradually attenuates with time to the ESD protecting circuit, and in the case where an abnormality occurs in the waveform of the current thus observed when the magnitude of the discharge voltage is sequentially increased, it is determined and confirmed that the electrostatic breakdown has occurred in the ESD protecting circuit.

Even when the aforementioned electrostatic breakdown test is performed, however it is impossible to perceive a specific situation as to how the ESD protecting circuit acts until it comes to the electrostatic breakdown, and a characteristic impedance of the ESD protecting circuit.

As shown in FIG. 6A, a transmission line pulse voltage (hereinafter referred to as "TLP voltage") which rises in accordance with a predetermined voltage rise rate to reach a peak voltage is applied to the ESD protecting circuit while the peak voltage is sequentially increased. In this case, when a correspondence relationship between each peak voltage of the TLP current which is caused to flow through the ESD protecting circuit in correspondence to the TLP voltage, and each peak value of the TLP voltage is represented in the form of a graph, it becomes clear that at the beginning, the ESD protecting circuit comes to a trigger generation state such that the peak voltage comes to the maximum value, a snapback state is then reached such that the voltage value abruptly drops and the current value gradually increases, and finally the ESD protecting circuit comes to a so-called conductive state such that the current value also gradually rises along with a rise in voltage value. Heretofore, there has been performed a so-called transmission line pulse measurement (hereinafter referred to as "TLP measurement") for measuring each of these states.

With the TLP measurement, it is possible to measure the characteristic impedance of the ESD protecting circuit in accordance with calculation of a ratio of a variation of peak voltage to a variation of peak current in the above-mentioned conductive state of the ESD protecting circuit. Moreover, it is also possible to perceive and measure the maximum current value at which the state of the ESD protecting circuit changes from the conductive state to the electrostatic breakdown state when the TLP voltage is sequentially increased.

However, this complicated operation such that a nearly trapezoid-shaped TLP voltages as shown in FIG. 6A are sequentially applied to sequentially obtain peak voltage vs. peak current characteristics as shown in FIG. 6B is essential to the TLP measurement. As a result, the above-mentioned Characteristic impedance of the ESD protecting circuit cannot be calculated and measured in a speedy manner.

Heretofore, in the field of such a TLP measurement, such technical means as to solve the technical disadvantages as described above has not yet been especially disclosed or suggested.

Actually, neither Patent Reference 1 nor Non-Patent Reference 1 discloses or suggests any technical means for solving the complication of the measurement as described above in the TLP measurement.

SUMMARY OF THE INVENTION

It is an object of the present invention to provide a method of quickly calculating and measuring a characteristic impedance of an ESD protecting circuit by applying a discharge voltage to the ESD protecting circuit, and a configuration of an apparatus which is capable of realizing the same.

In order to attain the above-mentioned object, basic constitutions of the present invention are as follows.

(1) A method of measuring a characteristic impedance of an electrostatic discharge protecting circuit, comprising the steps of: measuring a variation in discharge voltage applied to the electrostatic discharge protecting circuit with time, and a variation in discharge current caused to flow through the electrostatic discharge protecting circuit with time; simultaneously detecting a state when both the discharge voltage and the discharge current corresponding to each other are attenuated after both the discharge voltage and the discharge current sequentially rise to come individually to respective peak values based on an input to or an output from a computer; and taking a ratio of the variation of discharge voltage to the variation of discharge current in the attenuation process as an impedance value when the ratio is nearly constant.

(2) An apparatus for realizing a measurement of a characteristic impedance of the electrostatic discharge protecting circuit stated in (1) above, comprising: a pulse generating circuit; a discharging circuit for discharging electricity from the electrostatic discharge protecting circuit in accordance with an input from the pulse generating circuit; a voltage measuring circuit and a current measuring circuit which are interposed between each of the pulse generating circuit and the discharging circuit, and the electrostatic discharge protecting circuit; and a controller for instructing to the pulse generating circuit, the discharging circuit, the voltage measuring circuit, and the current measuring circuit in accordance with commands from a computer, wherein inputs based on measured values can be made from the voltage measuring circuit and the current measuring circuit to the computer.

DETAILED DESCRIPTION OF THE INVENTION

Figure 1A:
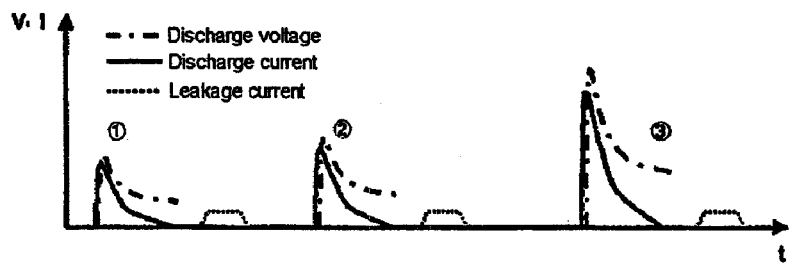
FIG. 1 represents the basic principle of the present invention, with FIG. 1A representing a situation of an applied discharge voltage and a discharge current caused to flow in correspondence to the discharge voltage, in which dotted lines on right-hand sides represent leakage currents caused to flow after application of the discharge voltage and conduction of the discharge current and FIG. 1B representing a graphical representation, based on voltage (V) vs. current (I) characteristic curves each based on a relationship between a discharge voltage and a discharge current corresponding to each other at the same times.

As apparent from the basic configuration (1), it is a requisite of the present invention that measured values of a discharge voltage and a discharge current corresponding to each other are detected at the same time, based on an input to or an output from a computer with respect to a varying state, in an applied discharge voltage and a discharge current corresponding to the applied discharge voltage, which is obtained in conformity with time as shown in FIG. 1A.

Figure 1B:
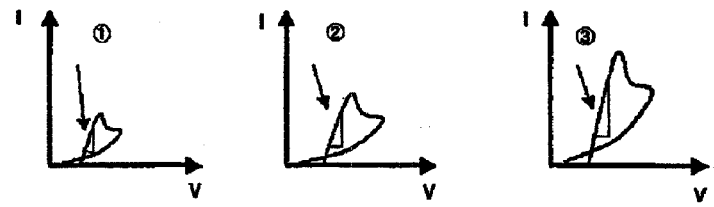

It becomes clear that as shown in FIG. 1B, although both the discharge voltage and the discharge current showing the correspondence relationship as described above rise at first, the discharge voltage sequentially decreases after firstly reaching the peak value, and thereafter the discharge current reaches the peak value, and then both the discharge voltage and the discharge current drop.

Each same time is normally set by the computer involved in the input and output as described above. However, once the measured values of the discharge voltage and the discharge current are input to the computer, outputs of the measured values are displayed in a state in which the correspondence relationship is understood by the computer (for example, a procedure will be adopted in which the outputs of the measured values are displayed in the form of the graph as shown in FIG. 1B, or numeric values of peak values of the measured values of the discharge voltage and the discharge current corresponding to each other at the same times are arranged in the same lines on both sides, respectively, and the lines are successively changed in display whenever a change occurs in the simultaneous measurement times time).

Typically embodiments in each of which such a measurement and an input to the computer are performed are as follows.

Figure 3A:
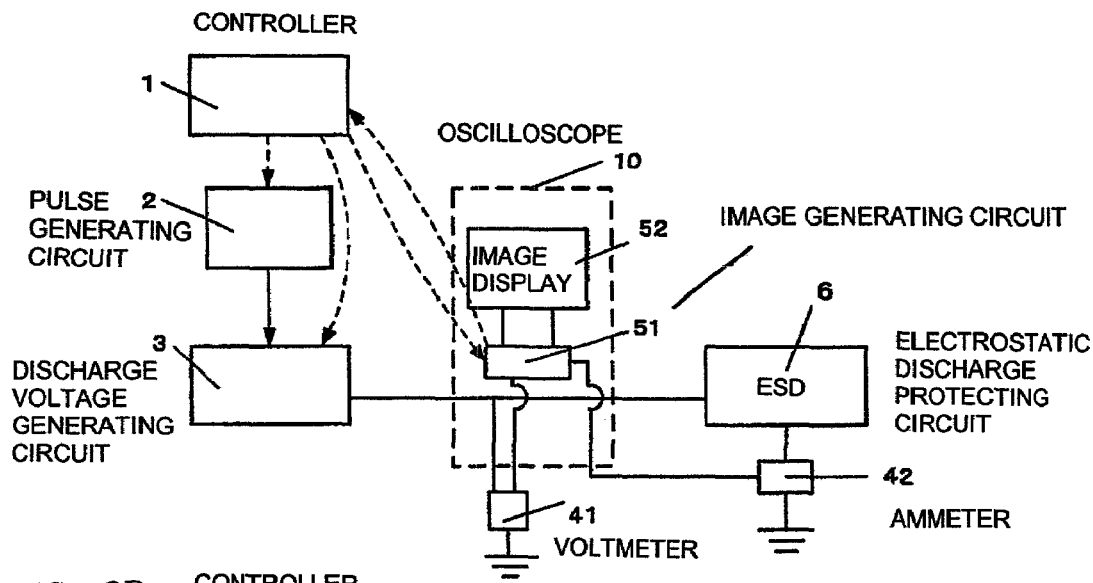
FIG. 3 represents a circuit block diagram showing an apparatus for realizing a measuring method of the present invention, with FIG. 1A showing an embodiment using an oscilloscope in order to measure a discharge voltage and a discharge current, and FIG. 1B showing an embodiment using a voltmeter and an ammeter with which digital measurement can be performed with time.

(A) A method comprising the steps of: interposing an oscilloscope 10 between a discharge pulse inputting circuit 3 and an electrostatic discharge protecting circuit 6 as shown in FIG. 3A; displaying variations in discharge voltage and discharge current with time in the form of an image; sequentially selecting simultaneous times based on the image display; and inputting measured values of the discharge voltage and the discharge current showing a relationship corresponding to each other at the same times in the image display to a computer.

Figure 3B:
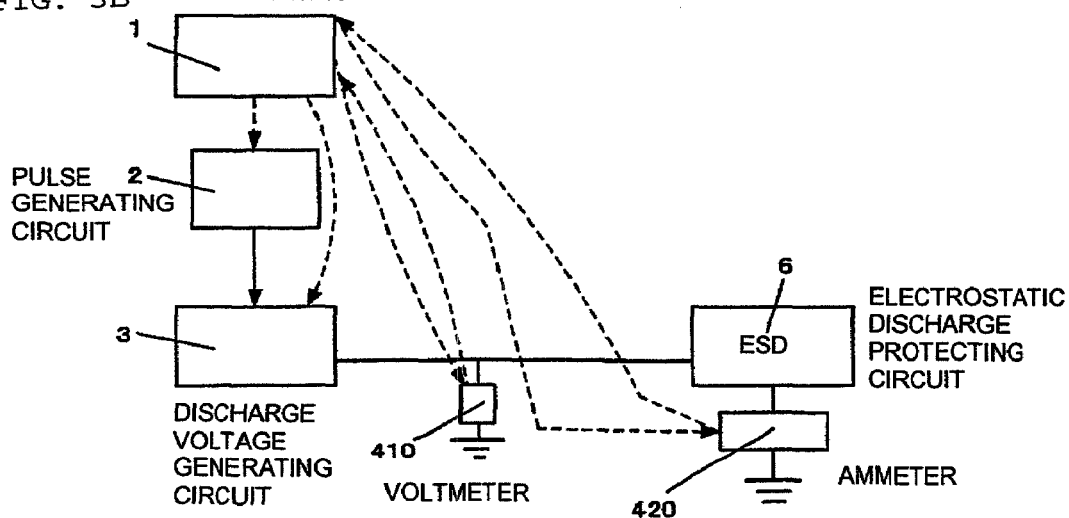

(B) A method comprising the steps of: measuring a discharge voltage by using a voltmeter 410 as shown in FIG. 3B capable of performing a digital measurement in conformity with a lapse of time; measuring a discharge current by using an ammeter 420 capable of performing a digital measurement in conformity with a lapse of time; and inputting digital measured values to a computer whenever a predetermined time occurs.

Here, in FIGS. 3A and 3B, a controller 1 instructs The discharge current generating circuit and the discharge voltage generating circuit 3 in accordance with selection of timing for an operation (indicated by dotted line arrows), and instructs the oscilloscope 10, and the digital voltmeter 410 and the digital ammeter 420 to set each simultaneous detection time (indicated by dotted line arrows). In addition, the oscilloscope 10, and the digital voltmeter 410 and the digital ammeter 420 transmit respective measured values to the computer of the controller 1 (indicated by dotted line arrows).

As shown in FIG. 3A, the oscilloscope 10 according to the embodiment of the present invention includes a voltmeter 41, an ammeter 42, an image generating circuit 51, and an image display screen 52 as essential constituents.

Figure 2:
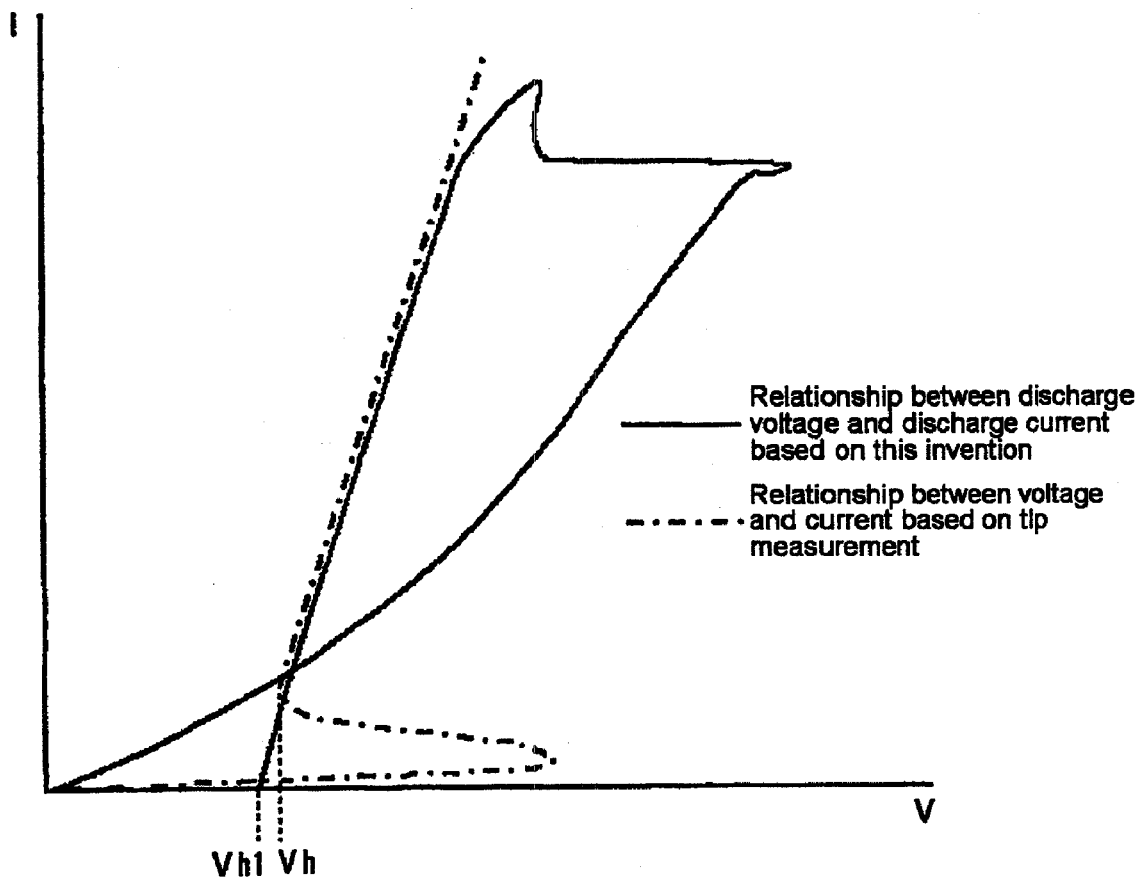
FIG. 2 is a graphical representation showing voltage (V) vs. current (I) characteristics based on a relationship between a discharge voltage and a discharge current corresponding to each other, and comparing the relationship with a relationship between the discharge voltage and the discharge current based on a TLP measurement.

Although the embodiment of the method described in the basic constitution (1) is not intended to be limited to those described in (A) and (B), normally, the relationship between the discharge voltage and the discharge current corresponding to each other is displayed in the form of graphs as shown in FIG. 1B and FIG. 2 based on the outputs from the computer.

In the graphic display forms as shown in FIG. 1B and FIG. 2, a ratio of a variation of discharge voltage to a variation of discharge current is nearly constant as shown in FIG. 1B and FIG. 2 at a stage in which no ESD protecting circuit 6 is broken. Moreover, such variations, as shown in FIG. 2, lie in a state bearing a close resemblance to the linearity of voltage vs. current characteristics in a so-called conductive state when the TLP measurement is performed.

That is to say, the basic and technical idea of the Present invention lies in that the characteristic impedance of the ESD protecting circuit 6 is quickly measured based on calculation of the ratio of the variation of discharge voltage to the variation of discharge current by utilizing the near agreement of the voltage (V) vs. current (I) characteristics at a drop stage with the conductive state in the TLP measurement after the relationship between the discharge voltage and the discharge current which move together at the same times for the ESD protecting circuit 6 is determined based on the input to or the output from the computer.

The above-mentioned basic configuration (2) is common in that it includes the controller 1, the pulse generating circuit 2, and the discharge voltage generating circuit 3, and the discharge voltage is applied to the ESD protecting circuit, similarly to the case of the normal ESD breakdown voltage measurement. However, the above-mentioned basic configuration (2) is different from the ESD breakdown voltage measuring apparatus in that each of the voltage measuring circuit and the current measuring circuit (especially, the circuit constituted by the oscilloscope 10 including the voltmeter 41 and the ammeter 42 as shown in FIG. 3A, or the circuit including the digital voltmeter 410 and the digital ammeter 420 as shown in FIG. 3B) is interposed between the discharge voltage generating circuit 3 and the ESD protecting circuit 6. To the contrary, the above-mentioned basic configuration (2) is common to the TLP measuring circuit in that each of the voltage measuring circuit and the current measuring circuit is interposed between the discharge voltage generating circuit 3 and the ESD protecting circuit 6.

However, the above-mentioned basic configuration (2) is different from the case of the TLP measurement in that although in the case of the TLP measurement, the TLP voltage and the TLP current are merely individually measured, with the above-mentioned basic configuration (2), the discharge voltage and the discharge current are measured at the same time, and the relationship between the discharge voltage and the discharge current is processed all at once based on the input to or the output from the computer to be determined.

With regard to an embodiment of the above-mentioned basic configuration (2), there are suitably adopted:

a configuration adopting the oscilloscope 10 including the voltmeter 41 and the ammeter 42 as the voltage measuring circuit and the current measuring circuit, respectively, as shown in FIG. 3A, in correspondence to the above-mentioned (A), and a configuration including the voltage measuring circuit, as shown in FIG. 3B, including the digital voltmeter 410 capable of performing the digital measurement with time, and the current measuring circuit, as shown in FIG. 3B, also including the digital ammeter 420 capable of performing the digital measurement with time in correspondence to the configuration of the above-mentioned (B).

Normally, before and after the measurement of the discharge voltage and the discharge current, a leakage voltage is applied to the ESD protecting circuit 6, and it is then tested whether or not a leakage current varies, thereby checking to see if or not the ESD protecting circuit 6 can normally operate.

Consequently, if a variation occurs in the leakage current when the leakage measurement is performed before and after the measurement of the discharge voltage and the discharge current, it is recommended that since the ESD protecting circuit 6 has already been in an abnormal state, the measurement of the discharge voltage and the discharge current is stopped, or an electrostatic breakdown voltage is applied as the discharge voltage to the ESD protecting circuit 6 all at once to measure the breakdown characteristics.

In the case where a switch 7 is provided in the apparatus as shown in FIG. 3, it is possible to prevent an influence of a high impedance on the discharge voltage measuring circuit side when the leakage measurement is performed.

Figure 4:
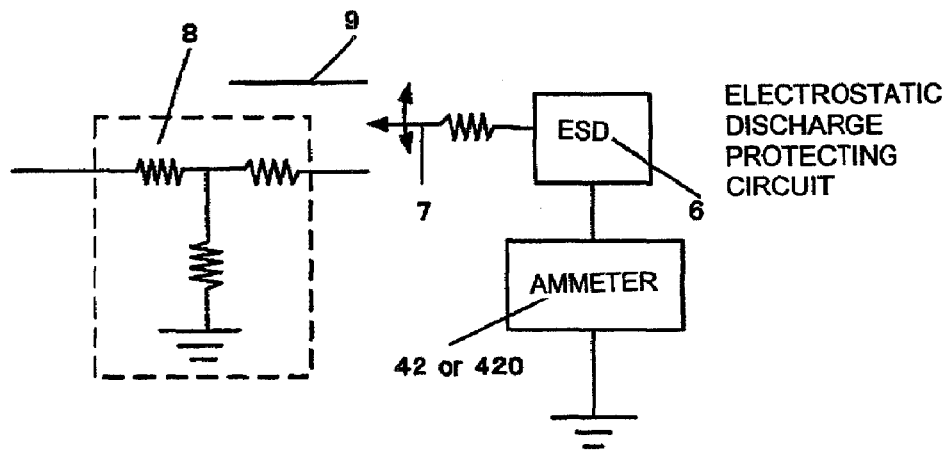
FIG. 4 is a local circuit block diagram showing a circuit in which a switch and a voltage dividing circuit are set in order to measure a leakage current.

In addition, in the case where as shown in FIG. 4, a voltage dividing circuit 8 is provided between each of the discharge voltage measuring circuit and the discharge current measuring circuit, and the ESD protecting circuit 6, an inductance between each of the discharge voltage measuring circuit and the discharge current measuring circuit, and the ESD protecting circuit 6 can be made small, and also the precise voltage vs. current characteristics can be obtained.

The present invention will be described hereinafter based on Embodiments.

EMBODIMENTS

Embodiment 1

The feature of Embodiment 1 is that it can judge that at a stage in which the ratio of the variation of discharge voltage to the variation of discharge current becomes unable to be maintained in a nearly constant state to come to fluctuate, the electrostatic discharge protecting circuit comes to the electrostatic breakdown.

Figure 5:
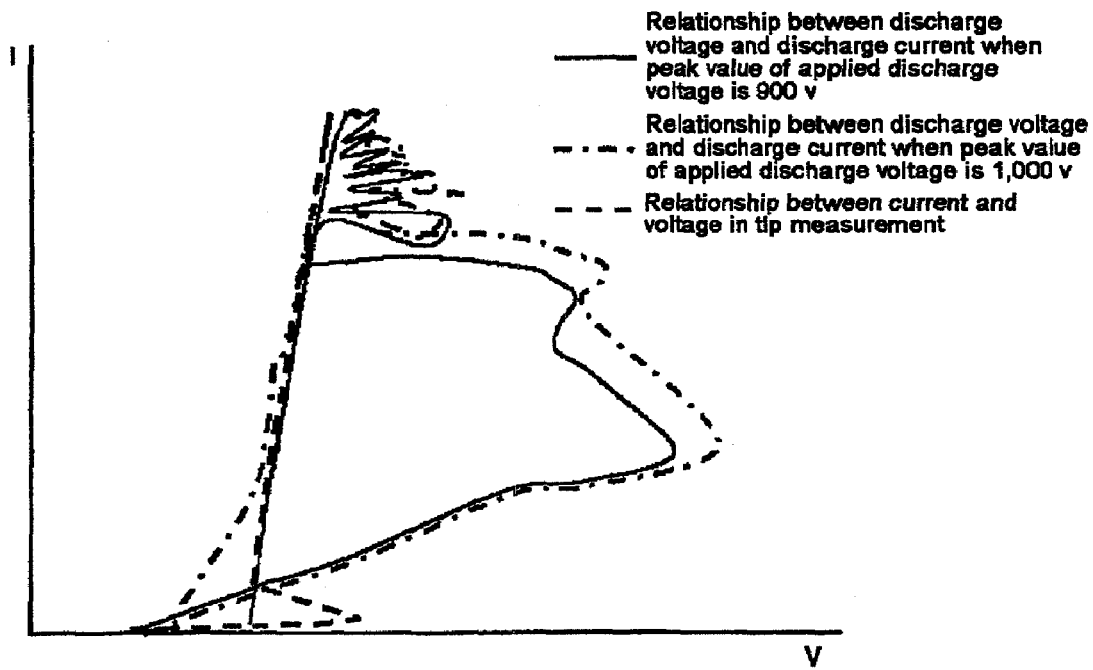
FIG. 5 is a graphical representation based on a relationship between a discharge voltage and a discharge current immediately before and after occurrence of electrostatic breakdown.
Figure 6A:
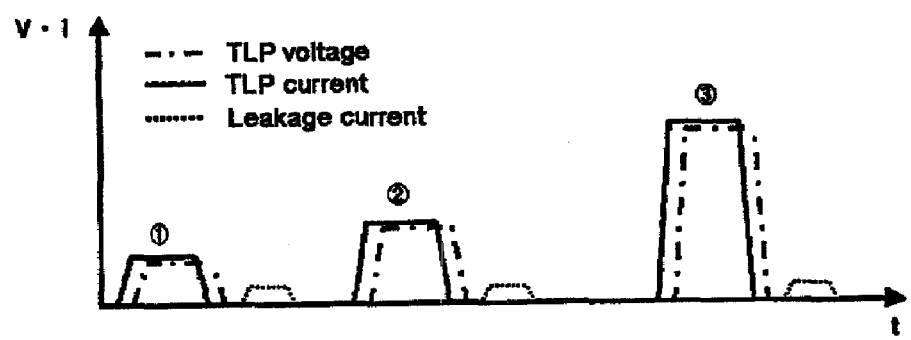
FIG. 6 represents a situation of a TLP measurement, with FIG. 1A showing a situation in which when a TLP voltage and a peak value are sequentially increased, a peak value of a flowing TLP current also sequentially increases, and FIG. 1B showing a situation in which a voltage (V) vs. current (I) characteristic curve showing a correspondence relationship between a peak value of a TLP voltage and a peak value of a TLP current obtained based on the increase is sequentially formed.
Figure 6B:
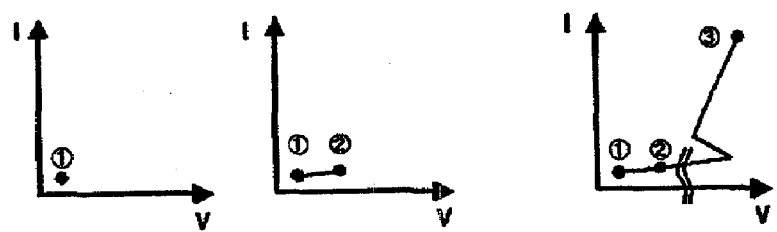

That is to say, as shown in FIG. 5, when the electrostatic breakdown occurs at the drop stage of the discharge voltage and the discharge current, a rate at which the discharge voltage decreases becomes large in relation to that at which the discharge current decreases. As a result, the ratio of the variation of discharge voltage to the variation of discharge current becomes unable to be maintained at such a constant value as to express the predetermined characteristic impedance, and such a phenomenon makes it impossible to calculate the characteristic impedance. To the contrary, however, the ESD protecting circuit 6 cannot hold the discharge voltage, which makes it possible to judge that the electrostatic breakdown has occurred in the ESD protecting circuit 6.

Embodiment 2

The feature of Embodiment 2 is that in case where, when the discharge input voltage is made to sequentially rise, the discharge voltage and the discharge current corresponding to each other sequentially rise, so that when the discharge current comes to the peak current value, the maximum current with which the state of the electrostatic discharge protecting circuit changes from the conductive state to the electrostatic breakdown state can also be measured with the maximum value of the discharge current at the stage in which the ratio of the variation of discharge voltage changed to the variation of discharge current does not become constant.

That is to say, as shown in FIG. 5, when the discharge voltage of 900 V for the human body charging model, for example, is applied as the discharge voltage, a change in discharge voltage or a change in discharge current is constant. In addition, when the discharge voltage of 1,000 V is applied, as described in Embodiment 1, the electrostatic breakdown occurs. In either case, however, the peak value of the current agrees with the maximum value of the current when the TLP measurement is performed. As a result, it becomes possible to perceive and measure the maximum current value when the state changes from the conductive state to the state in which the electrostatic breakdown begins.

Embodiment 3

The feature of Embodiment 3 is that it is possible to also measure the value of the discharge voltage at a stage in which both the discharge voltage and the discharge current attenuate, and the discharge current becomes null.

That is to say, as shown in FIG. 2, a voltage value Vh1 corresponding to the discharge current I=0 as the final stage of the attenuation process of the discharge voltage and the discharge current is measured. In this case, the voltage value Vh1 shows a relationship of nearly corresponding to a voltage value Vh when the state changes from the snapback state to the conductive state in the TLP measurement.

When a protecting element in the discharge protecting circuit is designed, the voltage value Vh in the TLP measurement corresponds to data to be considered when the minimum withstand voltage characteristics are set. However, essentially, the output impedance in the ESD measurement is different from that in the TLP measurement. Hence, for the design of the protecting element in the ESD protecting circuit, the voltage value Vh does not necessarily become the sufficient data to be considered.

On the other hand, although the voltage value Vh1 measured in Embodiment 3 shows a value slightly smaller than that of the voltage value Vh, it is very useful as showing the minimum withstand voltage characteristic which the protecting element in the ESD protecting circuit should have.

EFFECTS OF THE INVENTION

According to the present invention, the characteristic impedance of the ESD protecting circuit can be quickly calculated and measured, and the electrostatic breakdown for the ESD protecting circuit can be determined based on the basic configurations (1) and (2) as the solving means. Moreover, it becomes possible to perceive and measure the maximum current at the stage in which the state changes from the conductive state to the electrostatic breakdown state.

The present invention can be used not only in the measurement of the characteristic impedance of the ESD protecting circuit 6, but also in the electrostatic breakdown test. Thus, applications of the present invention are broad in scope.

What is claimed is:

1. A method of measuring a characteristic impedance of an electrostatic discharge protecting circuit, comprising the steps of:
    measuring a variation with respect to time of a discharge voltage applied to the electrostatic discharge protecting circuit, and a variation with respect to time of a discharge current resulting from the applied discharge voltage, the discharge current caused to flow through the electrostatic discharge protecting circuit;
    detecting a state when both the discharge voltage and the discharge current are attenuated after both the discharge voltage and the discharge current arrive individually at respective peak values in response to an input to or an output from a computer; and
    determining a ratio of the variation of discharge voltage with respect to time to the variation of discharge current with respect to time during the attenuation as an impedance value when the ratio is nearly constant.

2. The method of measuring a characteristic impedance of an electrostatic discharge protecting circuit according to claim 1, further comprising the steps of:
    interposing an oscilloscope between a discharge pulse inputting circuit and an electrostatic discharge protecting circuit;
    displaying variations in discharge voltage and discharge current with respect to time in the form of an image;
    sequentially selecting simultaneous detection times based on the image display; and
    inputting to a computer measured values of the discharge voltage and the discharge current showing a relationship of the discharge voltage and the discharge current at each simultaneous detection time in the image display.

3. The method of measuring a characteristic impedance of an electrostatic discharge protecting circuit according to claim 1, further comprising the steps of:
    measuring a discharge voltage by using a voltmeter capable of performing a digital measurement in conformity with a lapse of time;
    measuring a discharge current by using an ammeter capable of performing a digital measurement in conformity with a lapse of time; and
    inputting digital measured values to the computer at simultaneous detection times.

4. The method of measuring a characteristic impedance of an electrostatic discharge protecting circuit according to claim 1, further comprising the step of:
    displaying a relationship between the discharge voltage and the discharge current corresponding to each other in the form of a graph based on an output from the computer.

5. The method of measuring a characteristic impedance of an electrostatic discharge protecting circuit according to claim 1, further comprising the step of:
    determining that an electrostatic breakdown of the electrostatic discharge protecting circuit occurs when the ratio of the variation of discharge voltage to the variation of discharge current cannot be maintained in a nearly constant state.

6. The method of measuring a characteristic impedance of an electrostatic discharge protecting circuit according to claim 1,
    wherein when a discharge voltage inputted to the electrostatic discharge protecting circuit is made to sequentially rise, the discharge voltage and the discharge current corresponding to each other sequentially rise, so that when the discharge current arrives at a peak current value, a maximum current at which the electrostatic discharge protecting circuit changes from a conductive state to an electrostatic breakdown state can also be measured, wherein the maximum value of the discharge current is measured when the ratio of the variation of discharge voltage to the variation of discharge current is not constant.

7. The method of measuring a characteristic impedance of an electrostatic discharge protecting circuit according to claim 1, further comprising the step of measuring the value of the discharge voltage at a stage in which both the discharge voltage and the discharge current attenuate, and the discharge current becomes null.

8. The method of measuring a characteristic impedance of an electrostatic discharge protecting circuit according to claim 1, wherein a discharge voltage adapted to generate electrostatic breakdown in the electrostatic discharge protecting circuit is applied to the electrostatic discharge protecting circuit when no leakage current is caused to flow through the electrostatic discharge protecting circuit.

9. An apparatus for realizing a measurement of a characteristic impedance of an electrostatic discharge protecting circuit comprising:
    a pulse generating circuit;
    a discharge voltage generating circuit for discharging electricity from the electrostatic discharge protecting circuit in response to an input from the pulse generating circuit;
    a voltage measuring circuit and a current measuring circuit which are interposed between the discharge voltage generating circuit, and the electrostatic discharge protecting circuit;
    the voltage measuring circuit measuring a variation with respect to time of a discharge voltage applied to said electrostatic discharge protecting circuit;
    said current measuring circuit measuring a variation with respect to time of a discharge current caused to flow through the electrostatic discharge protecting circuit; and
    a controller for instructing the pulse generating circuit, the discharge voltage generating circuit, the voltage measuring circuit, and the current measuring circuit in response to commands from a computer, said controller detecting a state when both the discharge voltage and the discharge current corresponding to each other are attenuated, after both the discharge voltage and the discharge current arrive individually at respective peak values in response to an input to or an output from a computer, the computer determining a ratio of the variation of discharge voltage to the variation of discharge current during the attenuation as an impedance value when the ratio is nearly constant wherein inputs based on measured values are inputted from the voltage measuring circuit and the current measuring circuit to said computer.

10. The apparatus according to claim 9, wherein a voltage dividing circuit is provided between the pulse generating/inputting circuit and the electrostatic discharge protecting circuit.

11. The apparatus according to claim 9, wherein an oscilloscope is used as the voltage measuring circuit and the current measuring circuit.

12. The apparatus according to claim 9, wherein the voltage measuring circuit includes a voltmeter capable of performing a digital measurement with time, and the current measuring circuit comprises an ammeter capable of performing a digital measurement with time.

* * * * *